(12) United States Patent
Chen et al.

(10) Patent No.: US 7,884,472 B2
(45) Date of Patent: Feb. 8, 2011

(54) SEMICONDUCTOR PACKAGE HAVING SUBSTRATE ID CODE AND ITS FABRICATING METHOD

(75) Inventors: Chin-Ti Chen, Hsinchu (TW);
Ching-Wei Hung, Hsinchu (TW);
Bing-Shun Yu, Hsinchu (TW); Chin-Fa Wang, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 400 days.

(21) Appl. No.: 12/052,357

(22) Filed: Mar. 20, 2008

(65) Prior Publication Data

US 2009/0236739 A1 Sep. 24, 2009

(51) Int. Cl.
*H01L 23/48* (2006.01)
(52) U.S. Cl. .............................. 257/737; 257/E23.023; 257/E21.502; 438/127
(58) Field of Classification Search .................. 257/737, 257/E23.023, E21.502; 438/127
See application file for complete search history.

(56) References Cited

U.S. PATENT DOCUMENTS 6,589,801 B1 * 7/2003 Yoon et al. ..................... 438/15

6,668,449 B2 * 12/2003 Rumsey et al. ................. 29/840
2007/0220742 A1 * 9/2007 Lo et al. ........................ 29/825

* cited by examiner

*Primary Examiner*—Davienne Monbleau
*Assistant Examiner*—Monica D Harrison
(74) *Attorney, Agent, or Firm*—Muncy, Geissler, Olds & Lowe, PLLC

(57) ABSTRACT

A semiconductor package with a substrate ID code and its manufacturing method are revealed. A circuit and a solder mask are formed on the bottom surface of a substrate where the solder mask covers most of the circuit and a circuit-free zone of the substrate. A chip is disposed on the top surface of the substrate. A substrate ID code consisting of a plurality of laser marks is inscribed in the solder mask or in a portion of an encapsulant on the bottom surface away from the circuit to show the substrate lot number on the bottom surface. Therefore, quality control and failure tracking and management can easily be implemented by tracking the substrate ID code from the semiconductor package without changing the appearance of the semiconductor package. Furthermore, the substrate ID code can be implemented by the existing laser imprinting machines for semiconductor packaging processes and be formed at the same time of formation of a product code. The complexity of the semiconductor packaging processes is not increased and the circuits of the substrates are not easily damaged.

6 Claims, 6 Drawing Sheets

SEMICONDUCTOR PACKAGE HAVING SUBSTRATE ID CODE AND ITS FABRICATING METHOD

FIELD OF THE INVENTION

The present invention relates to semiconductor devices, especially to a semiconductor package with substrate ID codes and its manufacturing method.

BACKGROUND OF THE INVENTION

Substrate strips, or called array packaging substrates and mother substrates, are widely implemented in semiconductor packaging processes as basic packaging components, essentially consisting of a plurality of substrate units from tens to hundreds arranged in multiple arrays. After semiconductor packaging, the arrayed substrates are singulated into individual packages each having one substrate unit. Conventionally, an ID code is disposed on a specific location of the substrate strip outside the substrate units for further production management, quality control, and failure tracking during substrate fabricating processes. However, the ID codes will be removed or covered after the semiconductor packaging processes. Moreover, the substrate cost is increased by putting substrate ID codes on the substrate strip.

According to a conventional method for forming substrate ID codes in semiconductor packages, the ID codes are formed in one thin metal film or other metal layers of the circuit substrate by a metal etching. However; the ID codes are covered by packaging components such as a chip or an encapsulant during semiconductor packaging processes and can not be recognized by vision inspections. Therefore, the ID codes of the substrates can not provide any information for quality control or failure tracking and management or process improvement from semiconductor packages.

SUMMARY OF THE INVENTION

The main purpose of the present invention is to provide a semiconductor package with a substrate ID code and its manufacturing method by laser imprinting to solve the issues mentioned above. The substrate ID code can be formed on the solder mask or on the encapsulant of the semiconductor packages located on the bottom surface of a substrate. Since the ID code is visible and inerasable on the bottom of the semiconductor package, this provides substrate lot numbers, product specifications, and manufacturers for quality control and failure tracking and management after semiconductor packaging processes without changing the appearance of the semiconductor packages.

The second purpose of the present invention is to provide a semiconductor package with substrate ID codes and its manufacturing method including a step of flipping the packaged substrate over. Accordingly, the substrate ID code can be formed by laser imprinting at the same time of forming a product code on the encapsulant without adjusting laser beam nor changing laser imprinting machines. The existing laser imprinting machines for semiconductor packaging processes can be implemented without increasing the complexity of the semiconductor packaging processes nor damaging the circuits of the substrates.

According to the present invention, a semiconductor package with substrate ID codes is revealed, primarily comprising a substrate, a chip, and a substrate ID code. The substrate has a top surface and a bottom surface including a circuit and a solder mask formed on the bottom surface. The bottom surface includes a circuit-free zone without the circuit. The solder mask covers most of the circuit and the circuit-free zone. The chip is disposed on the top surface of the substrate. The substrate ID code consists of a plurality of laser marks shown on the bottom surface of the substrate away from the circuit. The manufacturing method of the semiconductor device is also revealed.

DETAIL DESCRIPTION OF THE INVENTION

Figure 1:
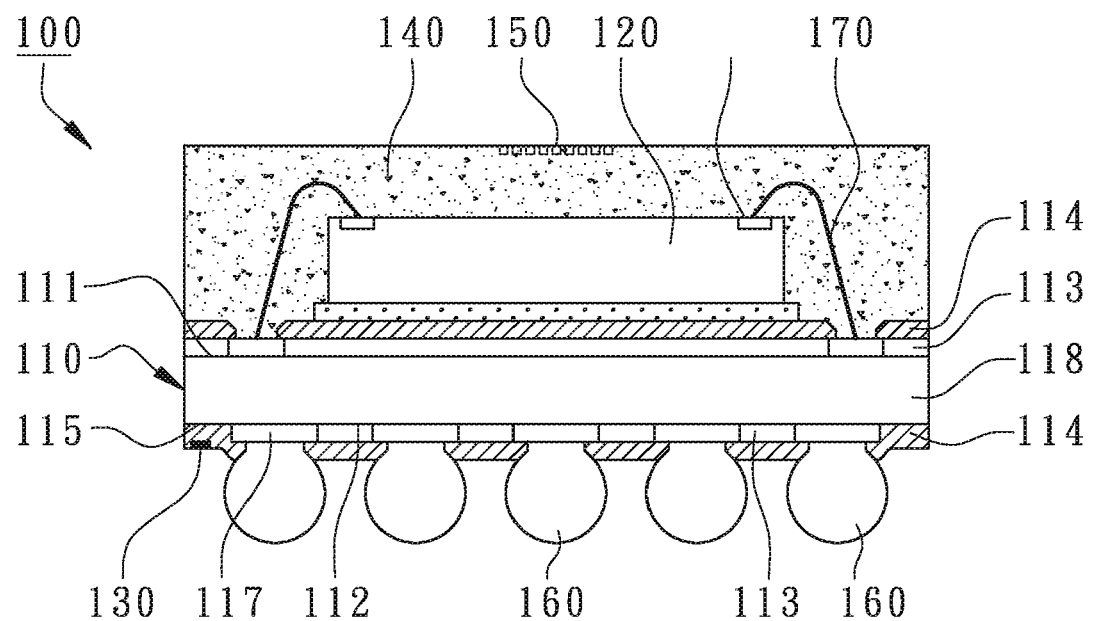
FIG. 1 shows a cross-sectional view of a semiconductor package with a substrate ID code according to the first embodiment of the present invention.

Please refer to the attached drawings, the present invention will be described by means of embodiments below.

According to the present invention, a semiconductor package 100 primarily comprises a substrate 110, a chip 120, and a substrate ID code 130 where the substrate 110 has a top surface 111 and a bottom surface 112. The substrate 110 serves as a chip carrier with single-layer or multiple-layer circuits. The substrate 110 includes a circuit 113 and a solder mask 114 formed on the bottom surface 112. In the present embodiment, the substrate 110 is a multiple-layer circuit board further including another circuit 113 and another solder mask 114 formed on the top surface 111. Therein, the circuit 113 on the top surface 111 is electrically connected to the circuit 113 on the bottom surface 112 by a plurality of vias or called PTH's (Plated Through Holes), not shown in figures. The circuit 113 on the top surface 111 includes a plurality of internal pads for electrically connecting the chip 120 and the circuit 113 on the bottom surface 112 includes a plurality of external pads 117 for disposing a plurality of external terminals 160.

The bottom surface 112 of the substrate 110 includes a circuit-free zone 115. Moreover, the solder mask 114 covers most of the circuit 113 and the circuit-free zone 115. The circuit-free zone 115 is opposing to the disposition area of the circuit 113. There is no circuit formed in the circuit-free zone 115, for example located at the edges or at the corners of the bottom surface 112.

The chip 120 is disposed on the top surface 111 of the substrate 110. In the present embodiment, the back surface of the chip 120 is attached to the top surface 111 of the substrate 110 by a die-attaching material such as a B-stage paste, a PI tape, or liquid epoxy. Furthermore, the chip 120 has a plurality of bonding pads 121 disposed on the active surface. The chip 120 is electrically connected to the substrate 110 by a plurality of electrical connecting components 170 such as bonding wires from the bonding pads 121 to a plurality of internal pads of the substrate 110 on the top surface 111.

Figure 2:
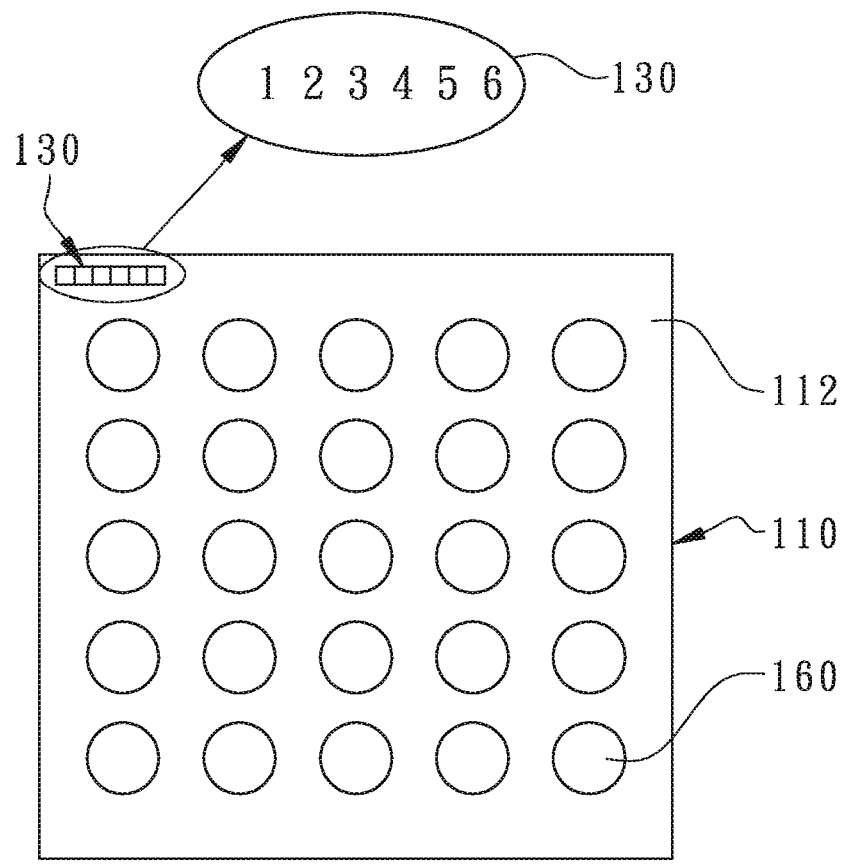
FIG. 2 shows a bottom surface of a substrate of the semiconductor package to show the substrate ID code according to the first embodiment of the present invention.
Figure 3:
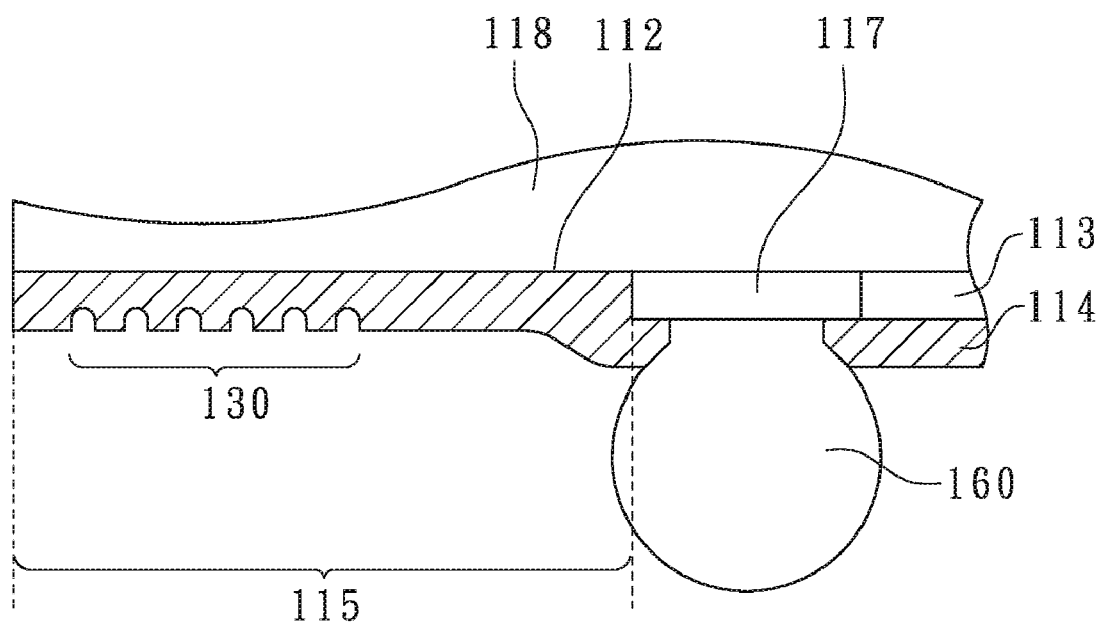
FIG. 3 shows a partial enlarged view of the substrate ID code visible and inerasable on the bottom of the semiconductor package according to the first embodiment of the present invention.

As shown in FIG. 1, FIG. 2, and FIG. 3, the substrate ID code 130 consists of a plurality of first laser marks located on the bottom surface 112 of the substrate 110 away from the circuit 113. Accordingly, the substrate ID code 130 is visible and inerasable on the bottom of the semiconductor package 100. In one embodiment but not limited, as shown in FIG. 2, the first laser marks are 1, 2, 3, 4, 5, and 6 as shown on the upper left corner of the bottom surface 112. To be more specific, as shown in FIG. 3, the substrate ID code 130 is burned in the solder mask 114 located in the circuit-free zone 115 by laser imprinting. The location to form the substrate ID code 130 is at one of the edges or at one of the corners of the bottom surface 112 so that the substrate ID code 130 is away from the central area of the bottom surface 112 corresponding to the chip attaching area of the top surface 111 occupied by the chip 120. Therefore, the IC inside the chip 120 will not be damaged during the laser imprinting processes.

In this embodiment, as shown in FIG. 1, the semiconductor package 100 further comprises an encapsulant 140 formed on the top surface 111 of the substrate 110 to encapsulate the chip 120 and the electrical connecting components 170 to provide appropriate protections to avoid electrical short and external contaminations. Usually, the encapsulant 140 is an epoxy molding compound formed by transfer molding. The semiconductor package 100 may further comprise a product code 150 consisting of a plurality of second laser marks imprinted on the encapsulant 140 located on the top surface 111. Accordingly, the product code 150 and the ID code 130 can be created on the semiconductor package 100 by the same laser imprinting processes with the same machine, where the product code 150 is shown above the top of the encapsulant 140 to show the product specifications or manufacturer information. The product code 150 normally is chosen from a group of letters, figures, alphabets, numbers, 3D marks, etc.

In more detail, as shown in FIG. 2 and FIG. 3, the substrate ID code 130 is formed by discrete burning of a laser beam at the circuit-free zone 115 of the solder mask 114. The substrate ID code 130 is chosen from a group of numbers, texts, symbols, figures, etc to show the production lot numbers of the substrate 110, inspection numbers, location numbers, substrate strip numbers, or other processing related numbers of the substrate 110 to quickly know the substrate information of production dates, production time, production lines, production equipment, and suppliers.

Therefore, the major contribution of the present invention is to create the substrate ID code 130 after semiconductor packaging processes marked on the hidden bottom surface of the semiconductor package 100, i.e., on the bottom surface 112 of the substrate 110, for quality control and failure tracking and management. Furthermore, the semiconductor package 100 is electrically connected to an external printed circuit board, not shown in the figure, by the external terminals 160 where the encapsulant 140 above the top surface 111 is exposed so that the product code 150 can easily and clearly be seen. Moreover, the substrate code 130 is hidden at the bottom of the semiconductor package 100 so that the profile and appearance of the semiconductor package 100 will not be changed. Therefore, when failed or low yield semiconductor packages 100 were identified during FT or other packaging processes, the substrate ID code 130 hidden at the bottom of the semiconductor packages 100 can be used for quality control and for failure tracking and management.

Furthermore, the substrate ID code 130 can be formed in the same laser imprinting step by the existing laser imprinting machine during semiconductor packaging processes without increasing the complexity of the processing flow nor damaging the circuits 113 of the substrate 110. In the present embodiment, the substrate ID code 130 does not penetrate the solder mask 114, as shown in FIG. 3, by controlling the energy and focus of the laser beam to avoid damaging the core 118 or the internal circuits of the substrate 110.

Figure 4:
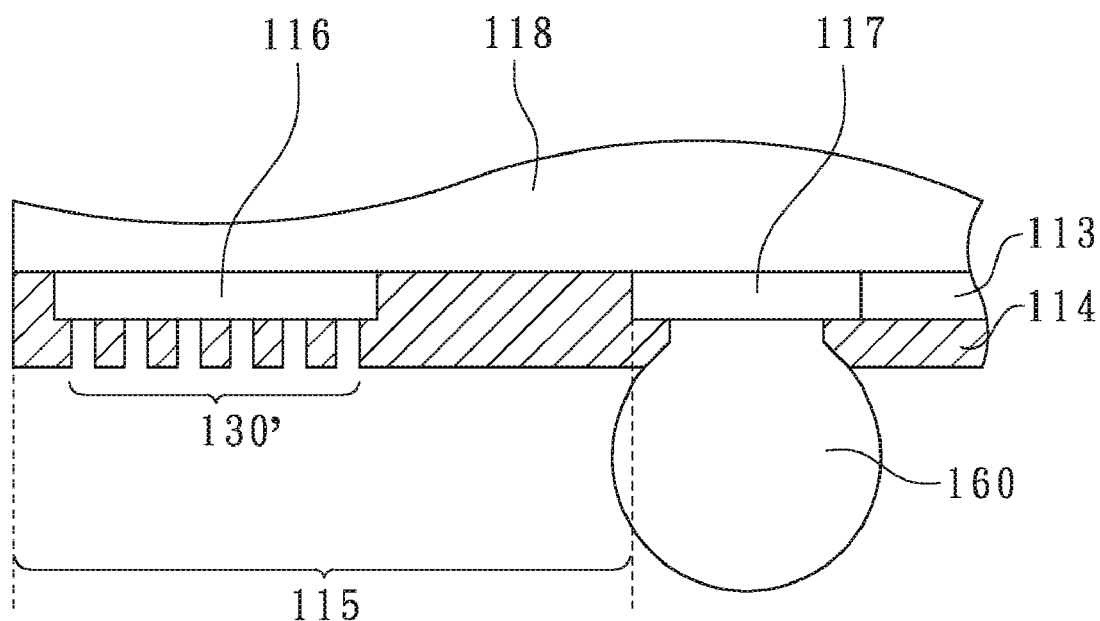
FIG. 4 shows a partial enlarged view of another substrate ID code on the semiconductor package according to the first embodiment of the present invention.

In a better embodiment, as shown in FIG. 4, a dummy metal pad 116 is formed on the bottom surface 112 of the substrate 110 located at the circuit-free zone 115 and is an independent metal island and is electrically isolated from the circuit 113. Another substrate ID code 130' can penetrate the solder mask 114 and stop at the dummy metal pad 116 where the dummy metal pad 116 can prevent damaging of the core 118 of the substrate 110 during the laser imprinting processes of forming the substrate ID code 130'.

The substrate ID code 130 and the product code 150 are imprinted on the insulating materials such as on the solder mask 114 or on the encapsulant 140, therefore, it is not required to change the laser beam nor to adjust the parameters of laser imprinting machine during laser imprinting. The substrate ID code 130 and the product code 150 can easily be created by a step of flipping the packaged substrate 110 over to achieve a doubt-sided laser imprinting.

Figure 5:
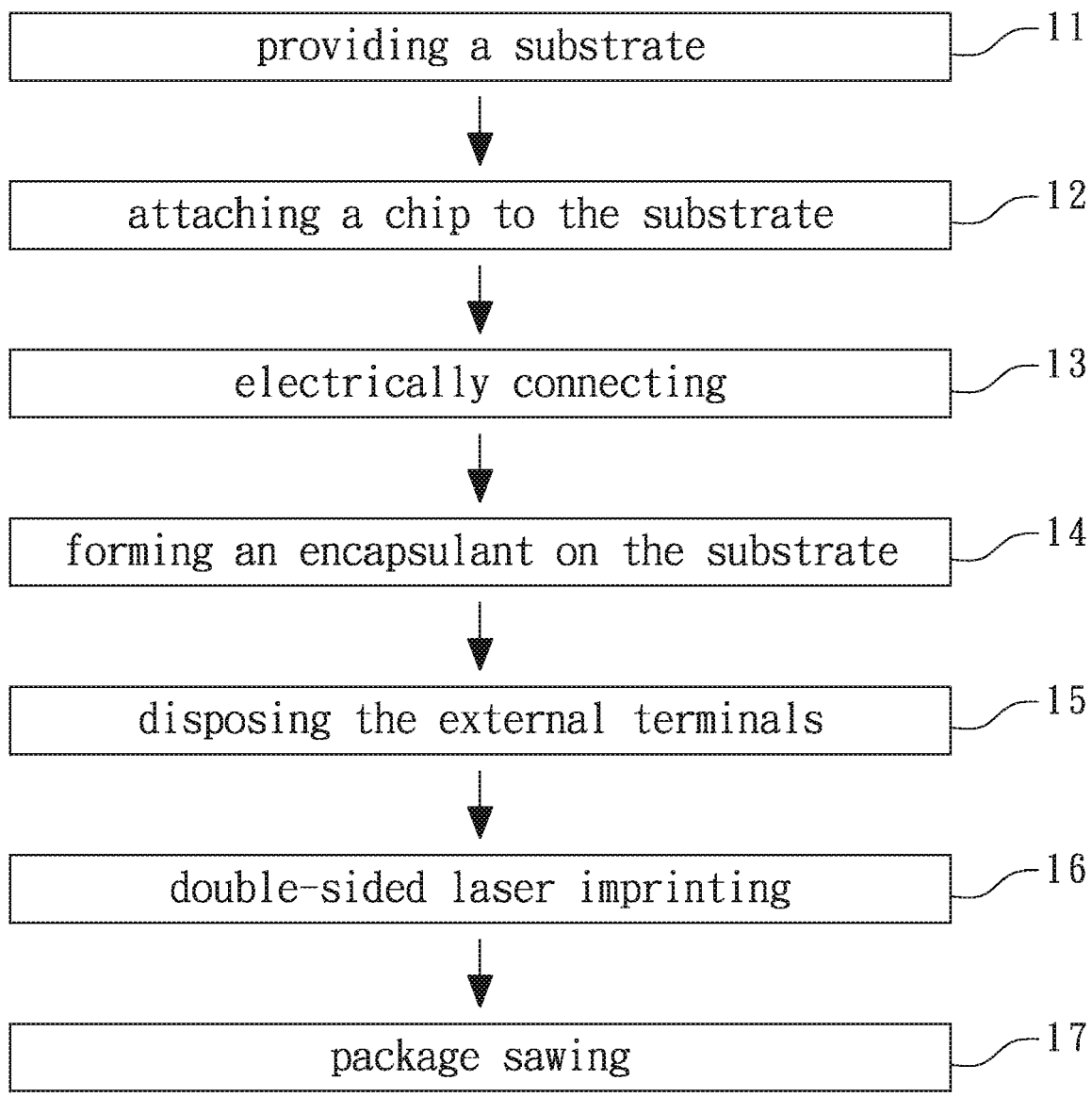
FIG. 5 shows a manufacturing process flow of the semiconductor package to form the substrate ID code according to the first embodiment of the present invention.
Figure 6:
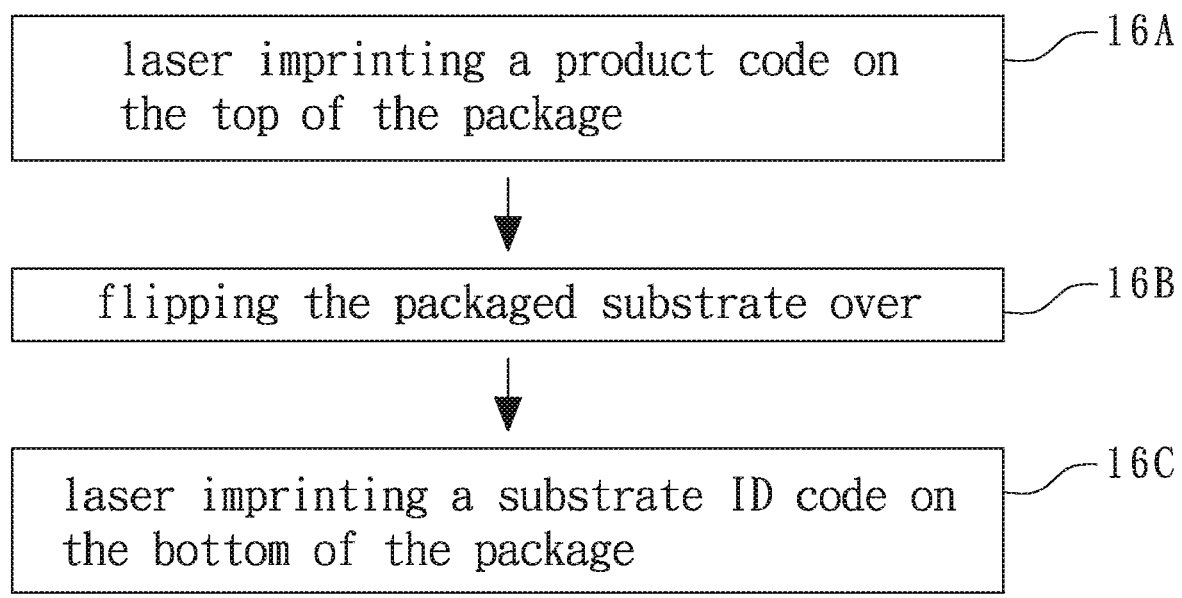
FIG. 6 shows the laser imprinting process flow of forming the substrate ID code according to the first embodiment of the present invention.

As shown in FIG. 5, the manufacturing processing flow of the semiconductor package 100 is revealed according to the present invention. The processing flow comprises: "providing a substrate" as step 11, "attaching a chip to the substrate" as step 12, "electrically connecting" as step 13, "forming an encapsulant on the substrate" as step 14, "disposing the external terminals" as step 15, "double-sided laser imprinting" as step 16, and "package sawing" as step 17. Therein, as shown in FIG. 6, "double-sided laser imprinting" of step 16 further comprises three sub-steps of: "laser imprinting a product code on the top of the package" as step 16A, "flipping the packaged substrate over" as step 16B, and "laser imprinting a substrate ID code on the bottom of the package" as step 16C. The detail processing flow is described as follows according to FIG. 1.

Firstly, step 11 is performed, where a substrate 110 is provided to be the chip carrier of the semiconductor package 100 as shown in FIG. 1. In step 11, a plurality of substrates 110 are integrally formed on a substrate strip, or an arrayed substrate, or a mother substrate.

Then, in the step 12, a chip 120 is attached to the top surface 111 of the substrate 110. But it is not limited that more chips 120 can be attached on the top surface 111 of the substrate 110 such as three, four, or more to form a stacked semiconductor package. Then, in the step 13 of electrically connecting, a plurality of electrical connecting components 170 such as a plurality of bonding wires are formed by wire bonding so that the bonding pads 121 of the chip 120 are electrically connected to the internal pads of the substrate 110.

Then, in the step 14, an encapsulant 140 is formed on the top surface 111 of the substrate 110 by transfer molding to encapsulate the chip 120 and the electrical connecting components 170.

Then, in the step 15, a plurality of external terminals 160 are disposed on the external pads 117 on the bottom surface 112 of the substrate 110 by ball placement or by solder reflow. The external terminals 160 can be metal balls, solder pastes, contact pads, or contact pins. In the present embodiment, the external terminals 160 are solder balls to form a multi-chip BGA package.

Then, step 16 is performed. As shown in FIG. 6, the doubled laser imprinting step 16 further comprising sub-steps 16A, 16B, and 16C. In sub-step 16A, as shown in FIG. 1, the product code 150 is burned in the top of the encapsulant 140 by laser imprinting. Then, sub-step 16B is to flip the packaged substrate 110 over so that the bottom surface 212 of the substrate 210 faces a laser beam head in a laser imprinting machine. And then, in sub-step 16C, the substrate ID code 130 is formed on the bottom surface 112 of the substrate 110 without damaging the circuit 113 by laser imprinting. Therefore, the product code 150 and the substrate ID code 130 are created during the doubled side laser imprinting step 16 including the flipping step 16B without changing the laser beam nor substantially adjusting the parameters of the laser imprinting machine.

Finally, step 17 is performed to singulate the semiconductor package 100. Since the manufacturing processing flow of the present invention, a plurality of substrates 110 are formed on a substrate strip. With a sawing tool, the substrate 110 can be singulated into required substrate dimensions to be the semiconductor package 100 as shown in FIG. 1. Each semiconductor package 100 has the substrate ID code 130 secretly visible at its bottom surface. Normally, a plurality of substrates 110 in a same substrate strip has a same substrate ID code 130. Therefore, the product code of the substrate strip can be tracked by the substrate ID code 130 on each semiconductor package 100 after packaging sawing. Once the semiconductor packages 100 are failed or low yield, the substrates 110 implemented in the semiconductor packages 100 can be tracked back to the substrate strip by the substrate ID codes 130 for failure analysis to avoid further yield loss and to enhance production yield.

Figure 7:
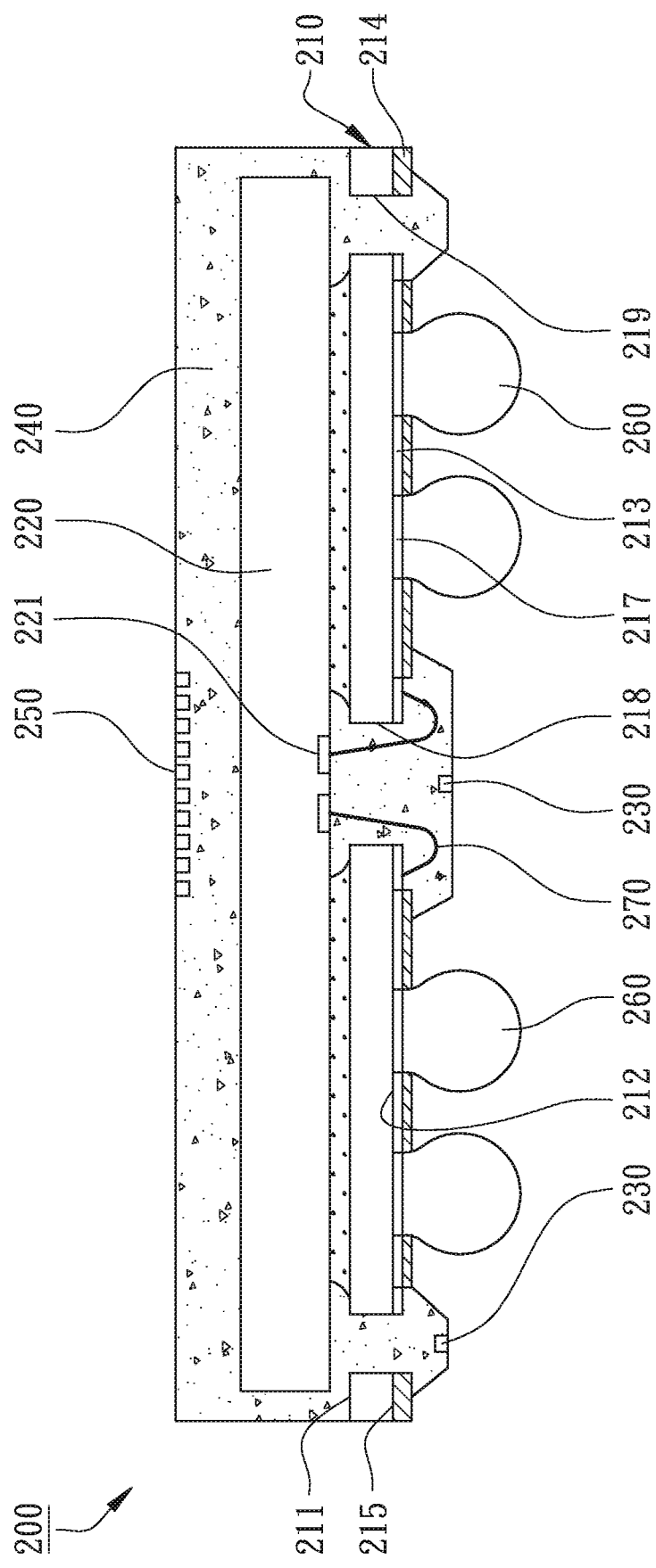
FIG. 7 shows a cross-sectional view of another semiconductor package with a substrate ID code according to the second embodiment of the present invention.

In the second embodiment of the present invention, as shown in FIG. 7, another semiconductor package with substrate ID codes is revealed. The semiconductor package 200 primarily comprises a substrate 210, a chip 220, and a substrate ID code 230 where the substrate 210 has a top surface 211 and a bottom surface 212. The substrate 210 includes a circuit 213 and a solder mask 214 on the bottom surface 212. The chip 220 is disposed on the top surface 211 of the substrate 210. The bottom surface 212 includes a circuit-free zone 215 where the circuit-free zone 215 is an area on the bottom surface 212 without any circuit 213. The solder mask 214 covers most of the circuit 213 and the circuit-free zone 215. The substrate 210 has a central slot 218 and a plurality of corner holes 219. The bonding pads 211 on the active surface of the chip 220 are aligned within the central slot 218 when the chip 220 is attached. The chip 220 is electrically connected to the substrate 210 by a plurality of electrical connecting components 270 passing through the central slot 218. Preferably, there is no circuit nor solder mask on the top surface 211 of the substrate to form a low-cost substrate.

Figure 8:
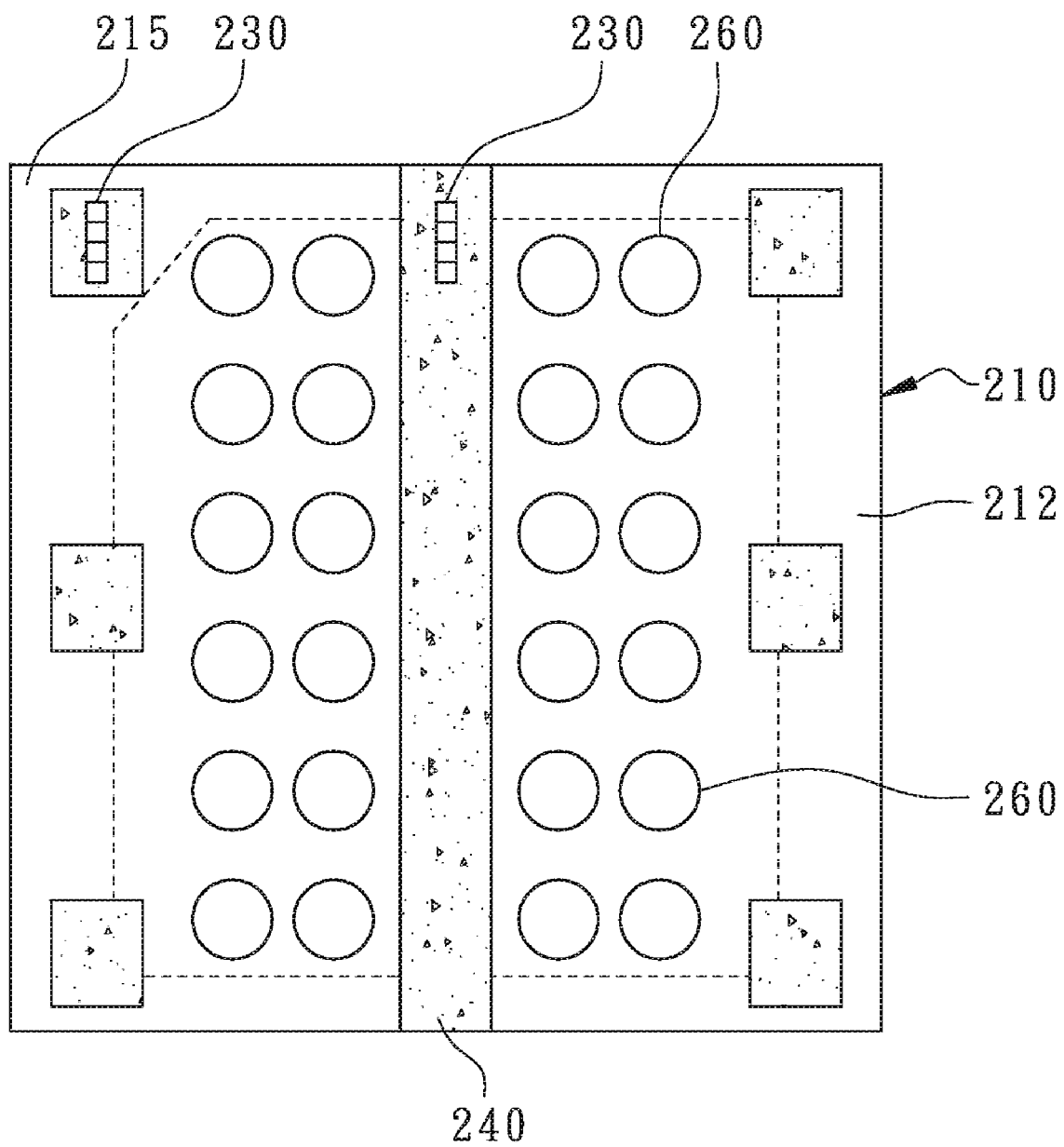
FIG. 8 shows a bottom surface of a substrate of the semiconductor package according to the second embodiment of the present invention.

An encapsulant 240 is formed on the top surface 211 of the substrate 210 to encapsulate the chip 220, the electrical connecting components 270 and fills the central slot 218, and the corner holes 219. The encapsulant 240 is partially formed on and extruded from the bottom surface 212 of the substrate 210 through the central slot 218, and the corner holes 219, as shown in FIG. 7 and FIG. 8. The portion of the encapsulant 240 covered the central slot 218 is a central encapsulant strip. The portion of the encapsulant 240 covered the corner holes 219 further comprises a plurality of insulating bumps or peripheral encapsulant strip at the peripheries of the bottom surface 212.

The substrate ID code 230 consisting of a plurality of laser marks is visible on the bottom surface 212 of the substrate 210 away from the circuit 213 by laser imprinting. The substrate ID code 230 is a code recorded the production lot numbers of a substrate strip including the substrate 210. Furthermore, as shown in FIG. 7, the semiconductor package 200 further comprises a product code 250 formed on the top surface of the encapsulant 240 by laser imprinting to show the information of the package product specifications and the brand. Accordingly, the substrate ID code 230 and the product code 250 are formed on two opposing sides of the semiconductor package 200. The product code 250 is formed by laser imprinting first, then the packaged substrate 210 is flipped over, then to laser imprint the substrate ID code 230 by a same laser imprinting machine during semiconductor packaging processes. In the present embodiment, as shown in FIG. 7 and FIG. 8, the substrate ID code 230 is formed at the exposed encapsulant 240 on the bottom surface 212 of the substrate 210 such as at the central encapsulant strip formed by the encapsulant 240 encapsulating the central slot 218, preferably, at one side of the central encapsulant strip. Alternatively, the substrate ID code 230 is formed on the dummy insulating bumps formed by the encapsulant 240 encapsulating the corner holes 219 where the dummy bumps have no electrical connecting components passing through so that the electrical connecting components 270, the circuit 213 of the substrate, and the IC inside the chip 210 will not be damaged during the double-sided laser imprinting.

When the semiconductor packages 100, 200 are mounted on PCB, the product codes 150, 250 are obviously visible. However, the substrate ID codes 130 and 230 are formed on the semiconductor packages 100 and 200 and located at obscure positions but still visible without damaging the circuits of the substrates 110 and 210. Furthermore, by the double-sided laser imprinting step 16, the substrate ID codes 130 and 230 and product ID codes 150 and 250 are formed in the insulating materials such as solder masks or/and molding compounds at the same time. Since the substrate ID codes 130 and 230 and the product codes 150 and 250 can be formed during the laser imprinting step 16 by the existing laser imprinting machine. Manufacture of the semiconductor packages 100, 200 will not increase the complexity of the processing flow nor damaging the circuits 113 of the substrate 110.

The above description of embodiments of this invention is intended to be illustrative and not limiting. Other embodiments of this invention will be obvious to those skilled in the art in view of the above disclosure.

What is claimed is:

1. A semiconductor package primarily comprising:
   a substrate having a top surface and a bottom surface and including a circuit and a solder mask on the bottom surface, wherein the bottom surface includes a circuit-free zone, and the solder mask covers the circuit and the circuit-free zone;
   a chip disposed on the top surface of the substrate;
   a substrate ID code consisting of a plurality of first laser marks located on the bottom surface of the substrate away from the circuit;
   an encapsulant formed on the top surface of the substrate to encapsulate the chip; and
   a product code consisting of a plurality of second laser marks inscribed in the encapsulant on the top surface; wherein the encapsulant is further partially formed on the bottom surface of the substrate, wherein the substrate ID code is inscribed in the portion of the encapsulant on the bottom surface.

2. The semiconductor package as claimed in claim 1, further comprising a plurality of external terminals disposed on the bottom surface of the substrate.

3. A method of manufacturing a semiconductor package comprising the steps of:
   providing a substrate having a top surface and a bottom surface, the substrate including a circuit and a solder mask on the bottom surface, wherein the bottom surface includes a circuit-free zone, and the solder mask covers the circuit and the circuit-free zone;
   disposing a chip on the top surface of the substrate;
   performing a laser imprinting step, wherein a substrate ID code consisting of a plurality of first laser marks is formed on the bottom surface of the substrate away from the circuit; and
   further comprising the step of forming an encapsulant on the top surface of the substrate to encapsulate the chip before the laser imprinting step, wherein a product code consisting of a plurality of second laser marks is inscribed in the encapsulant on the top surface, wherein the encapsulant is further partially formed on the bottom surface of the substrate; wherein the substrate ID code is inscribed in the portion of the encapsulant on the bottom surface.

4. The method as claimed in claim 3, wherein the laser imprinting step includes flipping the substrate over for doubled-sided laser-imprinting so that the product code and the substrate ID code are formed in the same laser imprinting step.

5. The method as claimed in claim 3, further comprising the step of disposing a plurality of external terminals on the bottom surface of the substrate.

6. A method of manufacturing a semiconductor package comprising the steps of:
   providing a substrate having a top surface and a bottom surface, the substrate including a circuit and a solder mask on the bottom surface, wherein the bottom surface includes a circuit-free zone, and the solder mask covers the circuit and the circuit-free zone;
   disposing a chip on the top surface of the substrate;
   performing a laser imprinting step, wherein a substrate ID code consisting of a plurality of first laser marks is formed on the bottom surface of the substrate away from the circuit; and
   further comprising the step of forming an encapsulant on the top surface of the substrate to encapsulate the chip before the laser imprinting step, wherein a product code consisting of a plurality of second laser marks is inscribed in the encapsulant on the top surface, wherein the laser imprinting step includes flipping the substrate over for doubled-sided laser-imprinting so that the product code and the substrate ID code are formed in the same laser imprinting step.

* * * * *